(12) United States Patent
Yamanaka et al.

(10) Patent No.: US 9,976,228 B2
(45) Date of Patent: May 22, 2018

(54) METHOD FOR PRODUCING COLLOIDAL CRYSTAL AND COLLOIDAL CRYSTAL

(75) Inventors: Junpei Yamanaka, Nagoya (JP); Akiko Toyotama, Nagoya (JP); Masaaki Yamamoto, Nagoya (JP); Sachiko Onda, Nagoya (JP); Tohru Okuzono, Nagoya (JP); Fumio Uchida, Osaka (JP)

(73) Assignees: PUBLIC UNIVERSITY CORPORATION NAGOYA CITY UNIVERSITY, Nagoya-Shi (JP); FUJI CHEMICAL CO., LTD., Osaka-Shi (JP)

( * ) Notice: Subject to any disclaimer, the term of this patent is extended or adjusted under 35 U.S.C. 154(b) by 848 days.

(21) Appl. No.: 14/003,583

(22) PCT Filed: Mar. 3, 2012

(86) PCT No.: PCT/JP2012/055485
§ 371 (c)(1),
(2), (4) Date: Oct. 21, 2013

(87) PCT Pub. No.: WO2012/121180
PCT Pub. Date: Sep. 13, 2012

(65) Prior Publication Data
US 2014/0069326 A1 Mar. 13, 2014

(30) Foreign Application Priority Data

Mar. 8, 2011 (JP) .................................. 2011-050064

(51) Int. Cl.
*C30B 7/08* (2006.01)
*C01B 33/18* (2006.01)
(Continued)

(52) U.S. Cl.
CPC ............ *C30B 7/08* (2013.01); *C01B 33/1415* (2013.01); *C01B 33/18* (2013.01); *C08J 3/12* (2013.01);
(Continued)

(58) Field of Classification Search
CPC ... C01B 33/1415; C01B 33/18; C01G 23/047; C08J 2325/08; C08J 2433/12; C08J 3/12;
(Continued)

(56) References Cited

U.S. PATENT DOCUMENTS 6,074,441 A 6/2000 Schulte et al.
2007/0298536 A1* 12/2007 Ren ........................ B82Y 30/00
438/102

(Continued)

FOREIGN PATENT DOCUMENTS

JP 10-43502 A 2/1998
JP 11-319539 A 11/1999
(Continued)

OTHER PUBLICATIONS

Ramos et al., Surfactant-Mediated Two-Dimensional Crystallization of Colloidal Crystals, Science vol. 286 Dec. 17, 1999, 2325-2328.*

(Continued)

*Primary Examiner* — Hua Qi
(74) *Attorney, Agent, or Firm* — Birch, Stewart, Kolasch & Birch, LLP

(57) ABSTRACT

[Problem] To provide a method for producing a colloidal crystal, wherein the method is easily controlled and is capable of dealing with a wide range of types of colloidal particle.
[Solution] The method for producing a colloidal crystal in the present invention is characterized by comprising a preparation step of preparing a colloidal dispersion liquid, in
(Continued)

which colloidal particles are dispersed in a liquid comprising an ionic surfactant and a colloidal crystal can be formed due to temperature changes, and a crystallization step of formation of a colloidal crystal by changing the temperature of the colloidal dispersion liquid from a temperature region in which the colloidal crystal is not formed to a temperature region in which the colloidal crystal is formed.

15 Claims, 11 Drawing Sheets

(51) Int. Cl.
- C08J 3/12 (2006.01)
- C08J 3/14 (2006.01)
- C08J 3/16 (2006.01)
- C30B 29/60 (2006.01)
- C01B 33/141 (2006.01)
- C30B 5/00 (2006.01)
- C01G 23/047 (2006.01)

(52) U.S. Cl.
CPC .............. C08J 3/126 (2013.01); C08J 3/14 (2013.01); C08J 3/16 (2013.01); C30B 5/00 (2013.01); C30B 29/60 (2013.01); C01G 23/047 (2013.01); C08J 2325/08 (2013.01); C08J 2433/12 (2013.01)

(58) Field of Classification Search
CPC ...... C08J 3/126; C08J 3/14; C08J 3/16; C30B 329/60; C30B 35/00; C30B 37/08
See application file for complete search history.

(56) References Cited

U.S. PATENT DOCUMENTS

| | | | |
|---|---|---|---|
| 2008/0206562 | A1 | 8/2008 | Stucky et al. |
| 2008/0305968 | A1 | 12/2008 | Nakamura et al. |
| 2010/0261814 | A1* | 10/2010 | Hu .......................... C30B 5/00 524/81 |
| 2011/0123803 | A1* | 5/2011 | Yamanaka .............. C01B 33/14 428/401 |

FOREIGN PATENT DOCUMENTS

| | | |
|---|---|---|
| JP | 2001-79384 A | 3/2001 |
| JP | 2004-89996 A | 3/2004 |
| JP | 2005-325173 A | 11/2005 |
| JP | 2008-93654 A | 4/2008 |
| WO | 2007/038219 A2 | 4/2007 |
| WO | WO 2009145031 A1 * 12/2009 ............. C01B 33/14 |

OTHER PUBLICATIONS

Ramos et al., Surfactant-Mediated Two-Dimensional Crystallization of Colloidal Crystals, Science vol. 286 Dec. 17, 1999, pp. 2325-2328.*

Extended European Search Report dated Sep. 24, 2014, for European Application No. 12755281.8.

Ackerson et al., "Shear-induced partial translational ordering of a colloidal solid", Phys. Rev. vol. 30, No. 2, Aug. 1984, pp. 906-918 (addtional one p—Fig. 2).

Palberg et al., "Grain size control in polycrystalline colloidal solids", J. Chem. Phys. 102, Mar. 22, 1995, pp. 5082-5087.

PCT/ISA/210—International Search Report dated May 22, 2012, issued in PCT/JP2012/055485.

Ramos et al., "Surfactant-Mediated Two-Dimensional Crystallization of Colloidal Crystals", Science, Dec. 17, 1999, vol. 286, pp. 2325-2328.

Shinohara et al., "Melting of Colloidal Silica Crystals due to Unidirectional Cooling", Book of Abstracts the 60th Divisional Meeting on Colloid and Interface Chemistry, Sep. 20-22, 2007, and Sep. 19-23, 2007, 4 pages.

Wakabayashi et al., "Three-Dimensional Centimeter-Sized Colloidal Silica Crystals Formed by Addition of Base", Langmuir, 22, (2006), pp. 7936-7941.

Weissman et al., "Thermally Switchable Periodicities and Diffraction from Mesoscopically Ordered Materials", Science, vol. 274, Nov. 8, 1996, pp. 959-960.

Yamanaka et al., "One-Directional Crystal Growth in Charged Colloidal Silica Dispersion Driven by Diffusion of Base", Journal of the American Chemical Society, 2004; vol. 126, No. 23, pp. 7156-7157.

* cited by examiner

US 9,976,228 B2

METHOD FOR PRODUCING COLLOIDAL CRYSTAL AND COLLOIDAL CRYSTAL

TECHNICAL FIELD

The present invention relates to a method for producing a colloidal crystal using a colloidal dispersion liquid which is crystallized due to temperature changes.

BACKGROUND ART

Colloid means a state in which colloidal particles having a size of approximately several nm to several μm are dispersed in a medium. When an adequate condition is selected, colloidal particles are regularly disposed and form a structure called a "colloidal crystal". There are two types of the colloidal crystal.

The first type is a crystal formed in a colloidal system without particular interactions between particles (hard sphere system) on the condition that the particle volume fraction is approximately 0.5 (the concentration=50% by volume) or more. This is similar to a phenomenon that when macroscopic spheres are stuffed into a limited space, the spheres are regularly disposed.

The second type is a crystal structure formed by electrostatic interactions acting between particles in a dispersion system of charged colloidal particles (a charged colloidal system). The crystal is for example formed in a colloidal system obtained by dispersing particles made of a polymer (polystyrene, polymethyl methacrylate, etc.) having a dissociable group on the surface thereof and silica particles ($SiO_2$) in a polar medium such as water. Since electrostatic interactions extend to a long distance, the crystal can be formed even when the particle concentration is low (a distance between particles is long) and the particle volume fraction is approximately 0.001.

The present inventors have developed a means for controlling the formation of a colloidal crystal derived from a charged colloidal system (Patent Document 1). That is, the means is a method in which pyridine is added in a silica colloidal dispersion system, and by changing pH due to temperature changes using the temperature dependence of the degree of dissociation of pyridine, the number of surface charges on silica particles is changed to form a colloidal crystal. According to this method, colloidal crystals can be produced from a wide variety of charged colloidal systems without requiring special equipment and complicated steps.

The present inventors have further succeeded in producing a huge colloidal single crystal by developing this method (Patent Document 2). That is, this is a method for growing a colloidal crystal by putting a colloidal dispersion liquid, in which pyridine is added in a silica colloidal dispersion system, into a container in a state in which a colloidal crystal is not formed, setting one end of the container to the temperature at which a colloidal crystal is partially formed by heating, and growing a colloidal crystal by gradually expanding the range set to the temperature at which the colloidal crystal is formed. The colloidal crystal thus obtained is an extremely large single crystal and has fewer lattice defects and less unevenness.

PRIOR ART DOCUMENT

Patent Document

Patent Document 1: JP 11-319539 A
Patent Document 2: JP 2008-93654 A

SUMMARY OF THE INVENTION

Problems to be Solved by the Invention

In the above method in which pyridine is added in a silica colloidal dispersion system to produce a colloidal crystal due to temperature changes, however, there has been a problem in that a controllable range is limited because the surface charge of colloidal particles is controlled based on the temperature dependence of the degree of dissociation of a base. Because of this, it has often happened that an adequate condition setting for creating a colloidal crystal depending on types of colloidal particle cannot be found out. There has been also a problem in that production conditions such as water to be used and purity of a base must be strictly set to create a colloidal crystal with good reproducibility.

The present invention is made in view of such conventional circumstances, and a problem to be solved is to provide a method for producing a colloidal crystal, wherein the method facilitates control in the colloidal crystal production and is capable of dealing with a wide range of types of colloidal particle.

Means for Solving the Problems

The present inventors thought that the above conventional problems could be solved by controlling crystallization without relying on the temperature dependence of the degree of dissociation of a base for the growth of a colloidal crystal, using the temperature dependence of other characteristics. As a result of intensive investigation, the present inventors found that in a colloidal dispersion system to which an ionic surfactant was added, a colloidal crystal was formed by cooling and conversely the colloidal crystal was melted by heating, and further found that the phase transition temperature of crystallization/melting of a colloidal crystal was changed depending on types and concentrations of ionic surfactant, thereby completing the present invention.

That is, the method for producing a colloidal crystal in the present invention is characterized by comprising:

the preparation step of preparing a colloidal dispersion liquid, in which colloidal particles are dispersed in a liquid comprising an ionic surfactant and a colloidal crystal can be formed due to temperature changes, and the crystallization step of formation of a colloidal crystal by changing the temperature of the colloidal dispersion liquid from a temperature region in which the colloidal crystal is not formed to a temperature region in which the colloidal crystal is formed.

The principle of the method for producing a colloidal crystal in the present invention is considered as follows.

A colloidal crystal structure in a charged colloidal system is formed by electrostatic interactions acting between colloidal particles. The electrostatic interaction force varies depending on the number of surface charges on colloidal particles, and the ionic strength, particle concentration and dielectric constant in a liquid in which colloidal particles are dispersed. In general, as the number of surface charges and particle concentration increase and as the ionic strength and dielectric constant decrease, electrostatic interactions are strong and crystallization easily occurs. When an ionic surfactant is added to a charged colloidal system, a part of the ionic surfactant adsorbs to the surface of colloidal particles to increase the number of surface charges on colloidal particles. The adsorption amount at this time is a given amount due to the concentration of the ionic surfactant and the adsorption equilibrium depending on an affinity between the surfactant and the surface of particles. On the other hand, an ionic surfactant which does not adsorb is dissolved in a liquid in which colloidal particles are dispersed, and thus the ionic strength of the liquid increases.

In general, it has been revealed that as temperature increases, the adsorption amount of molecules to surfaces decreases from thermodynamics as follows (see the first chapter of "Adsorption", Tominaga Keii, Kyoritsu zensho 157, KYORITSU SHUPPAN CO., LTD., 1965). In a system before and after adsorption of molecules, when $\Delta G$ for the Gibbs free energy change, $\Delta H$ for the enthalpy change and $\Delta S$ for the entropy change are used and the temperature T of the system is constant, there is a relationship of $\Delta G=\Delta H-T\Delta S$, i.e. $\Delta H=\Delta G+T\Delta S$. The adsorption of molecules to interfaces is a change which spontaneously occurs, and at this time, $\Delta G$ is lower than 0. In addition, when molecules adsorb to surfaces, since the degree of freedom of motion decreases, entropy decreases ($\Delta S<0$). Therefore, $\Delta H$ is lower than 0 before and after adsorption, which means that energy is released in the form of heat. Therefore, it turns out that an adsorption phenomenon is accompanied with exothermic. Next, the influence of temperature changes in adsorption is considered. As temperature decreases, adsorption equilibrium is shifted to a direction in which the amount of heat generation increases (temperature increases) by the principle of Le Chatelier's law of mobile equilibrium. That is, an adsorption amount increases. Conversely, when temperature increases, an adsorption amount decreases.

The above theory also applies to a system, in which an ionic surfactant is added to colloidal particles, and a lower temperature increases an adsorption amount. A higher adsorption amount indicates a higher number of surface charges on colloidal particles. Simultaneously, since the concentration of surfactants dissolved in a medium becomes lower, the ionic strength is low. All of them increase electrostatic interactions between particles, and thus crystallization occurs under adequate conditions. That is, a colloidal crystal is formed by cooling. This means that the phase transition temperature of crystallization/melting of a colloidal crystal can be easily controlled by adjusting types of ionic surfactant and an amount added, and means that the present invention is a method for producing a colloidal crystal, wherein the method is capable of dealing with a wide range of the number of charges of colloidal particles.

Therefore, according to the method for producing a colloidal crystal in the present invention, the production of a colloidal crystal is easily controlled and a wide range of types of colloidal particles can be dealt with.

In the method for producing a colloidal crystal in the present invention, a crystal is formed by changing the number of surface charges on colloidal particles and the ionic strength in a medium through temperature changes. Because of this, the ionic surfactant is not particularly limited insofar as it adsorbs to particles to change the charge of colloidal particles and a part thereof can be dissolved in a liquid to be ions. Anionic surfactants, cationic surfactants and amphoteric surfactants can be used, which consist of several hydrophobic parts and hydrophilic parts. Among these, anionic surfactants and cationic surfactants are particularly preferred. This is because these have great effects of changing the charge of colloidal particles. In addition, preferred are surfactants having a charge with a sign equal to that of colloidal particles before adsorption. This is because surfactants having a charge with an opposite sign extremely reduce the total number of charges on particles depending on the conditions of additive concentration, and a repulsive force between colloidal particles becomes lower, and aggregation may occur.

In a method for producing a colloidal crystal, types of colloidal particle are not particularly limited, and inorganic particles such as silica and alumina; organic polymer particles such as acryl and polyethylene; and the like can be used. The present inventors have confirmed that a colloidal crystal can be certainly produced using silica colloidal particles, titania particles and organic polymer particles. Since the surfaces of silica particles and titania particles are hydrophilic, when an ionic surfactant with a hydrocarbon chain is adsorbed, the surface of silica particles is changed to hydrophobic in advance using e.g. a nonionic surfactant. When particles consisting of an organic polymer are used as colloidal particles, an organic polymer in which a dissociable group such as a pyridine group or a carboxylic acid group is introduced into an organic polymer can be used. Thus, the number of surface charges on colloidal particles and positive and negative thereof can be controlled depending on the amount and types of dissociable groups. The present inventors have confirmed that since a copolymer of styrene and 2-vinylpyridine salt has a positive surface charge, the number of surface charges can be controlled by further adding a cationic surfactant, and a colloidal crystal can be produced.

The concentration of ionic surfactant to be added is preferably below the critical micelle concentration. This is because in the case of a concentration equal to or higher than the critical micelle concentration, micelles along with colloidal particles are dispersed and a colloidal crystal may be disrupted, and further the system becomes complicated and control becomes difficult. In addition, since a part of the surfactant added is adsorbed by particles, even when the concentration of surfactant in a sample is equal to or higher than the critical micelle concentration, there is a need to be careful that the concentration of dissolved surfactant may not reach to the critical micelle concentration. That is, the more preferable range of the surfactant concentration in the method for producing a colloidal crystal in the present invention is the condition that the concentration of surfactant which is not adsorbed and is dissolved is equal to or lower than the critical micelle concentration.

The liquid in which colloid is dispersed is not particularly limited, and water and organic solvents can be used. Among these, water and an alcohol, which have a high dielectric constant, and a mixture of water and an alcohol are particularly preferred. The reason why is that the degree of dissociation of dissociable groups existing on the surface of colloidal particles (e.g. sulfone groups, sulfate groups, carboxyl groups for polymer particles, and hydroxyl groups for metallic oxide particles such as silica particles) is high, and thus the number of surface charges on particles becomes sufficiently large, and further the dissociation of ionic surfactant is promoted, which can contribute to controlling the surface charge of colloidal particles. Among these, when a high viscous liquid such as ethylene glycol or glycerin is used as a colloidal dispersion medium, since convection is less prone to occur due to high viscosity, a colloidal crystal can be expanded.

In the method for producing a colloidal crystal in the present invention, the crystallization step preferably comprises the temperature setting step of setting the whole of the colloidal dispersion liquid contained in a container to the temperature at which a colloidal crystal is not formed; the crystallization initiation step of setting the colloidal dispersion liquid which is set to the temperature at which a colloidal crystal is not formed, to the temperature at which a colloidal crystal is partially formed; and the crystal growth step of growing a colloidal crystal by gradually expanding the range set to the temperature at which the colloidal crystal is formed. This means is similar to the Bridgman method to obtain a single crystal of metal or semiconductor. According to the test results of the present inventors, the colloidal crystal thus obtained has fewer lattice defects and less unevenness. Because of this, it is considered that a large single crystal can be obtained.

Examples of a method for gradually expanding the range set to the temperature at which a colloidal crystal is formed include a method by, after setting one end of a container containing a colloidal dispersion liquid to the crystallization temperature of a colloidal crystal, gradually expanding the range of the temperature due to heat conduction; a method, after setting one end of a container containing a colloidal dispersion liquid to the crystallization temperature of a colloidal crystal, gradually putting it into an electric heater set to the crystallization temperature of the colloidal crystal; and the like. The second method has the advantage of being able to control the speed of crystal growth and further being able to control temperature over a larger area.

Furthermore, the incline of thermal conductivity is formed in a fixed direction by arranging materials with various thermal conductivities around the circumference of a cell, and the range set to the temperature at which a colloidal crystal is formed can be gradually expanded by cooling from the circumference. In addition, the range set to the temperature at which a colloidal crystal is formed may be gradually expanded by moving an infrared oven and an infrared radiation lamp, controlling the temperature of hotplate or the like.

Furthermore, in the method for producing a colloidal crystal in the present invention, after growing a colloidal crystal, the colloidal crystal can be immobilized by gelation. Thus, when a colloidal crystal is immobilized by gelation, even if the temperature is returned to the temperature at which the colloidal crystal is not formed, the structure of the colloidal crystal can be maintained. In addition, the mechanical strength of the colloidal crystal can be dramatically increased. Furthermore, the gelled colloidal crystal becomes a material which also has characteristics peculiar to gel matrix. For example, when a gelled colloidal crystal is mechanically compressed and transformed, since the crystal lattice spacing is also changed, a material in which diffraction wavelength can be controlled is obtained. A gelled colloidal crystal is expanded and diminished by responding physical and chemical environments such as types of liquid, temperature and pH. In addition, when a functional group which is specifically bound to a specific molecule is introduced, a volume thereof varies depending on the concentration of the molecular species. By measuring the shift of the diffraction wavelength using such property, the sensing of temperature, pH, various molecular species and the like can be carried out.

Examples of gelling methods include a method by dispersing a photo-curing polymer in a colloidal dispersion liquid, crystallization of a colloidal crystal, and then irradiating the colloidal crystal with light for gelation; and the like. In this case, a material with little generation of ions is preferably selected as a photo-curing gelling agent. The reason why is because when a photo-curing gelling agent which generates ions is used, the repulsive force between particles decreases due to an increase in ionic strength, and the structure of a colloidal crystal cannot be maintained and can be melted. Examples of such photo-curing gelling agents with little generation of ions include solutions comprising a gel monomer, a cross-linking agent and a photopolymerization initiator, and the like. Examples of gel monomers include vinyl monomers such as acrylamide and derivatives thereof; examples of cross-linking agents include N,N'-methylene-bis-acrylamide; and examples of photopolymerization initiators include 2,2'-azobis[2-methyl-N-[2-hydroxyethyl]-propionamide] and the like. Furthermore, for example, a water-soluble photosensitive resin obtained by attaching an azide photosensitive group to polyvinyl alcohol can be also used.

In the crystallization step in the method for producing a colloidal crystal in the present invention, a part of a colloidal crystal is set to the temperature at which the colloidal crystal is melted by a temperature adjusting means to form a melting region, and the crystal can be grown by recrystallizing a melted region by a zone melting method by which the melting region is moved.

That is, in the method for producing a colloidal crystal, the crystallization step is carried out by the following steps:
(1) the temperature setting step of setting the whole of the colloidal dispersion liquid contained in a container to the temperature at which a colloidal polycrystal is formed;
(2) the crystal melting step of, in the colloidal dispersion liquid set to the temperature at which a colloidal polycrystal is formed, forming a melting region set to the temperature at which a colloidal crystal is not partially formed; and
(3) the recrystallization growth step of growing a colloidal crystal by gradually moving the melting region.

According to this method, a huge colloidal single crystal can be easily produced. Further, when colloidal particles as impurities exist in a colloidal polycrystal dispersion liquid, the method also has an effect of preventing the colloidal particles as impurities from going into a colloidal single crystal.

Here, the melting region can be moved by a temperature adjusting means and a moving means which is capable of relative displacement with a container. By moving the melting region as described above, the relative displacement speed of the melting region is slowed, and recrystallization is slowly carried out from a melted state to a crystal state, and thus a single crystal can be intended to get larger and a single crystal can be quickly created by quickening the relative displacement speed of the melting region. Because of this, the quality of a colloidal crystal and production efficiency can be intended to balance depending on objects.

The melting region may be moved by moving a container, by moving a temperature adjusting means, or by moving both the container and the temperature adjusting means.

In the containing step, a colloidal polycrystal dispersion liquid is preferably filled between two walls which face almost parallel. By doing this, free convection is less prone to occur in the container and the colloidal crystal growth is less prone to be disturbed, and thus a larger-sized single crystal having fewer lattice defects and less unevenness can be produced. In this case, a direction in which the temperature of a colloidal dispersion system is changed may be either a direction parallel to the wall or a direction perpendicular to the wall.

Mode for Carrying Out the Invention

In the present invention, examples of liquids in which colloidal particles are dispersed include water, but liquids other than water can be also used. Formamides (e.g. dimethyl formamide) and alcohols (e.g. ethylene glycols) can be for example used. These can be directly used depending on combinations of colloidal particles and ionic surfactants to be added, but, in general, are preferably used as a mixture with water.

Since the formation of a colloidal crystal is inhibited by the existence of a small amount of salt (ionic impurities), it is preferred that desalination be sufficiently carried out in the preparation of a colloidal dispersion system. When water is used, for example, first dialysis is carried out with purified water until the electric conductivity of water to be used becomes almost equal to a value before use, and next a sufficiently washed ion-exchange resin (a mixed bed of cation and anion exchange resins) is put in contact with a sample and this is maintained for at least one week to carry out desalination and purification.

Colloidal particles which are used for a colloidal dispersion liquid are not particularly limited, and various inorganic particles and organic particles can be used. It is desired, however, that the particle diameter be as equal as possible. For a colloidal dispersion liquid, particles with a relatively equal size may be used as colloidal particles, which are obtained by dispersing commercially available particles for colloid in a proper dispersion medium such as water, by using inorganic particles synthesized by the sol-gel method or the like and by polymerizing a monomer such as styrene by emulsion polymerization or the like.

Furthermore, there is a need to pay attention to the particle diameter of colloidal particles and distribution thereof. The particle diameter of colloidal particles is preferably 600 nm or less, further preferably 300 nm or less. The reason why is because in the case of colloidal particles with a large particle diameter of above 600 nm, sedimentation easily occurs by the influence of gravity. The standard deviation of the particle diameter of colloidal particles is preferably within 15%, further preferably 10% or less. When the standard deviation becomes large, a crystal is less prone to be formed. Even if a crystal is formed, lattice defects and unevenness increase and it is difficult to obtain a colloidal crystal with high quality.

The concentration of colloidal particles may be suitably determined depending on types of colloidal particle, types of surfactant and the like, and, in general, is approximately 0.01 to 0.05 as $\varphi$ (the volume fraction of colloidal particles). A colloidal dispersion system is prepared so that the concentration of ionic surfactant will be approximately 2 to 10 $\mu$mol/L. To do this, the specific gravity of colloidal particles is measured by a pycnometer method or the like, and using this value, the $\varphi$ value of colloidal particles in a purified colloidal dispersion system can be determined by an absolute dry method. By diluting this colloidal dispersion system by adding a liquid medium such as purified water, a dispersion system with a given $\varphi$ value can be prepared. The $\varphi$ value is calculated so that a colloidal crystal will have the interplanar spacing of the crystal depending on desired characteristics. As needed, the salt concentration may be adjusted by adding an aqueous solution of low molecular salt such as NaCl.

In the above preparation of a colloidal dispersion liquid, there is a need to avoid contamination by ionic impurities as much as possible. In view of this, since soda-lime glass or the like, in which basic impurities are eluted in water, increases the number of charges on particles, when a glass container is used, a container made of glass such as silica glass, in which basic impurities are not eluted in water, is preferred. Carbon dioxide in air is dissolved in water to generate carbonic acid, and thus it is desired that a colloidal dispersion liquid be prepared under an atmosphere of nitrogen or the like. Furthermore, a container and tools are used after sufficiently washed with purified water (an electric conductivity of 0.6 $\mu$S/cm or less).

In the method for producing a colloidal crystal in the present invention, colloid can be heat-reversibly crystallized by an easy means by simply heating or cooling a system from the outside. The freezing point temperature can be controlled by changing types and concentrations of ionic surfactant. In addition, an ionic substance is secondarily put therein, and the freezing point temperature can be adjusted by changing the concentration thereof.

In the present invention, a system is preferably maintained in a closed system. This can prevent contamination by ionic impurities and produce a colloidal crystal with good reproducibility.

In the crystallization step in the method for producing a colloidal crystal in the present invention, the colloidal crystal is formed by changing the temperature of a colloidal dispersion liquid from a temperature region in which a colloidal crystal is not formed to a temperature region in which the colloidal crystal is formed. For the control of temperature in this crystallization step, the Krafft point of ionic surfactant should be considered as described below. The Krafft point herein means the temperature at which the solubility of an ionic surfactant rapidly increases. As bonds between surfactant molecules in a solid state are strong, the Krafft point tends to be high. Therefore, as a hydrocarbon chain length increases, the Krafft point becomes high. The Kraft point also varies depending on types of counter ion. Here are examples of sodium alkyl sulfate.

Sodium dodecyl sulfate (the number of carbons in the alkyl group 12): 9° C.

Sodium tetradecyl sulfate (the number of carbons in the alkyl group 14): 30° C.

Sodium hexadecyl sulfate (the number of carbons in the alkyl group 16): 45° C.

Sodium octadecyl sulfate (the number of carbons in the alkyl group 18): 56° C.

The solubility of a surfactant is remarkably low at equal to or lower than the Krafft point. Since a surfactant remains in a solid state after added, the effects of washing, emulsification, bubbles and the like are very low. Since the solubility of a surfactant, however, varies depending on temperature even at equal to or lower than the Krafft point, the adsorption amount of surfactant to colloidal particles, the ionic strength of a colloidal dispersion liquid and the like can be also controlled depending on temperature. Besides, the crystallization/melting of a colloidal crystal can be controlled. It is preferred, however, that a temperature region in which a colloidal crystal is formed in the crystallization step be equal to or higher than the Krafft point. The reason why is that in a temperature region equal to or higher than the Krafft point, the melting amount of surfactant can be increased and thus the adsorption amount of surfactant to colloidal particles, a dielectric constant and the like can be largely changed, and besides the crystallization/melting of a colloidal crystal can be also easily controlled.

The method for producing a colloidal crystal in the present invention can form a colloidal crystal by suitably selecting types of colloidal particle, types of liquid in which the colloidal particles are dispersed, types and amount added of ionic surfactant which is added to the liquid, and applying temperature changes thereto from outside. Using this property, the method can be applied to production of substances other than colloidal crystals.

Novel heat-sensitive materials (heat-sensitive paint, a temperature sensor etc.) can be, for example, developed using physical properties which are changed due to temperature changes. By using a system in which a colloidal system is crystallized by increasing temperature, the viscosity of the system is expected to increase with temperature. On the other hand, in normal simple liquids, in general, viscosity monotonously decreases with increasing temperature. Using such specific viscosity-temperature characteristic, for example, applications to an improvement in the temperature characteristics of liquids used for conventional stress transfer system (clutch oil) and the like are also expected.

EXAMPLES

Examples further embodying the present invention will now be described in detail.

Examples 1 to 5 and Comparative Example 1

<Preparation for Colloidal Particles>

As colloidal particles used for a colloidal dispersion liquid, polystyrene particles prepared as described below were used.

That is, styrene monomer (22 g), sodium styrene sulfonate (0.1 g) and divinylbenzene (1.11 g) were added to purified distilled water, and potassium persulfate (0.1 g) was added thereto as an initiator with stirring to carry out soap-free emulsion polymerization. After completion of the reaction, the reaction liquid was put into a dialysis tube, followed by dialysis, and further put through anion exchange resin column for purification to obtain an aqueous suspension of polystyrene particles. When the diameter of polystyrene particles in this suspension was measured by a dynamic light scattering method, the particle diameter was 132 nm.

<Creation of a Colloidal Dispersion Liquid>

To the suspension of polystyrene particles obtained as described above, a wide variety of anionic surfactants and dilution water were added to obtain a colloidal dispersion liquid, in which the particle concentration was 1% by volume and the concentration of anionic surfactant was a given concentration. The used anionic surfactants were sodium hexyl sulfate (the number of carbons in the alkyl group 6) in Example 1, sodium dodecyl sulfate (the number of carbons in the alkyl group 12, the critical micelle concentration CMC=8.2 mM (25° C.)) in Example 2, sodium tetradecyl sulfate (the number of carbons in the alkyl group 14, CMC=2.2 mM (40° C.)) in Example 3, sodium hexadecyl sulfate (the number of carbons in the alkyl group 16, CMC=0.58 mM (40° C.)) in Example 4 and sodium octadecyl sulfate (the number of carbons in the alkyl group 18, CMC=0.23 mM (40° C.)) in Example 5.

In Comparative Example 1, a colloidal dispersion liquid to which NaCl was added in place of an anionic surfactant was used.

<Determination of a Crystallization Phase Diagram>

In a colorless polymethyl methacrylate cell in the form of a prismatic container (internal dimensions of 10 mm×10 mm×45 mm), 1 ml of a colloidal dispersion liquid in Examples 1 to 5 and Comparative Example 1 obtained as described above was put, and this was tightly stoppered with a plastic cap. The colorless cell containing a colloidal dispersion liquid was put into a constant-temperature water bath set to a given temperature (every 10° C. from 5 to 55° C.), and visual inspection and reflectance spectrum measurement were carried out to confirm the existence of the formation of a colloidal crystal.

Thus, in colloidal dispersion liquids with various compositions, the existence of the formation of a colloidal crystal was investigated at various temperatures, and based on the results, a crystallization phase diagram was made, which showed a relationship between the concentration of surfactant and the freezing point temperature. The results are shown in FIG. 1 and FIG. 2. The rectangular symbol indicates the freezing point temperature. The temperature higher than the freezing point corresponds to a state that colloidal particles are distributed almost randomly (a "liquid" state) and the temperature lower than that corresponds to a crystal state. From these figures, it turned out that in Examples 1 to 5 to which an anionic surfactant was added, as an amount added increased, the freezing point of a colloidal crystal declined. In comparison of differences in anionic surfactants, in the plot of the freezing point temperature taken along the ordinate and the concentration of anionic surfactant taken along the abscissa, a slope was largely changed depending on the number of carbons in the alkyl group of an anionic surfactant. This means that the freezing point temperature of a colloidal crystal can be controlled by controlling the number of carbons and the concentration of surfactant. As the number of carbons in the alkyl group of an anionic surfactant increases, a slope becomes smaller. Consequently, it turned out that since by using an anionic surfactant with a large number of carbons in the alkyl group, changes in the freezing point temperature depending on changes in the concentration of anionic surfactant became smaller, the control of the freezing point due to changes in concentration of anionic surfactant could be more accurately carried out. Therefore, it turned out that in the method for producing a colloidal crystal, the number of carbons in the alkyl group of an anionic surfactant added to a colloidal dispersion liquid was preferably 10 or more, further preferably 12 or more and most preferably 14 or more.

In addition, the Krafft point of sodium octadecyl sulfate used in Example 5 is 56° C., and the temperatures applied when creating a crystallization phase diagram (50, 25, 5° C.) are temperatures lower than the Krafft point. From the results of the measurement of surface tension carried out separately, however, it is revealed that when sodium octadecyl sulfate is used, most of sodium octadecyl sulfate added is adsorbed to colloidal particles at any temperature of 50, 25 and 5° C. and a very small amount thereof is dissolved in water. The measurement of surface tension also shows that at this time, the dissolution concentration of sodium octadecyl sulfate is equal to or lower than each saturated solubility, and a solid is not precipitated. That is, about a pure aqueous solution of surfactant in which colloidal particles do not exist, if particles exist, the dissolution concentration is slight even at equal to or lower than the Krafft point thereof, and thus good results are obtained.

On the other hand, in Comparative Example 1 to which NaCl was added, the slope of the plot of the freezing point temperature (the ordinate) and the concentration of anionic surfactant (the abscissa) extremely became large and became almost vertical. It is believed that the reason why the slope did not become absolutely vertical is due to changes in permittivity of water due to temperature. That is, it turned out that since changes in the freezing point due to changes in NaCl concentration were large, the amount of NaCl added was required to be strictly controlled to form a colloidal crystal due to temperature changes and that was extremely difficult.

<Photography of Phase Transition of a Colloidal Dispersion Liquid>

The photographs of phase transition when changing a colloidal dispersion liquid from 25, 35, 50 to 5° C. were taken. As the colloidal dispersion liquid, a colloidal dispersion liquid was used, which comprised 2.5% by volume of aqueous suspension of polystyrene particles prepared in the above Examples, and to which sodium dodecyl sulfate was further added in order to be a given concentration. For comparison, a colloidal dispersion liquid was also used, which comprised 2.5% by volume of polystyrene particles (a diameter of 91.8 nm, the number of charges when not adding a surfactant=870) prepared in the same method as in the above Examples and to which sodium dodecyl sulfate was added in order to be a given concentration.

The results are shown in FIG. 3. In the case of a colloidal dispersion liquid to which sodium dodecyl sulfate was added, as shown in FIG. 3, when the concentration of sodium dodecyl sulfate was 60 μM or more, a colloidal crystal was melted at 50° C. and by returning to 5° C., a colloidal crystal was formed again. On the other hand, when the concentration of sodium dodecyl sulfate was 40 or less, a colloidal crystal was not melted even at 50° C.

The crystallization phase diagram of the above sample observed by photographs was created in the same method as the method for making the crystallization phase diagrams in Examples and Comparative Example as described above (see FIG. 4). In FIG. 4, the abscissa is the concentration of sodium dodecyl sulfate and the rectangle symbol is the freezing point.

<Evaluation of the Adsorption Amount of Surfactant>

When a surfactant is added to a polystyrene particle dispersed liquid, a part thereof adsorbs to the surface of polystyrene particles and the rest is dissolved in a medium to become an "adsorption equilibrium" state. The above Examples 1 to 5 and Comparative Example 1 are carried out on the concentration condition of equal to or lower than the critical micelle concentration, and thus micelles are not formed.

Until now, about the adsorption of anionic surfactants to polystyrene particles, the determination of adsorption amount, chain lengths thereof and temperature dependence have been reported (Document 1) to 3) described below). In general, the adsorption amount of substances decreases with increasing temperature. The adsorption of surfactants to polystyrene particles is confirmed to have the same behavior.

1) Paxton, T. R., J. Colloid Interf Sci., 1969, 31, 19.
2) Maron, S. H., Elder, M. E., Urevitch. I. N. J. Colloid Sci., 1954, 9, 89.
3) Piirma, I., Chen, S. R. J. Colloid Interf Sci., 1980, 74, 90.

The above polystyrene particles used in Examples 1 to 5 and Comparative Example 1 have a negative charge derived from copolymerized styrene sulfonic acid, and an anionic surfactant adsorbs thereto to increase the number of charges Z. In addition, when a surfactant is dissolved in a medium, the salt concentration in the medium Cs increases. When temperature T declines to increase the adsorption amount of surfactant (a dissolution concentration decreases), Z increases and Cs decreases. Both of these two changes increase electrostatic interactions between particles and thus are advantage for crystallization. It is believed that because of this, crystallization by cooling occurred in a surfactant-added colloidal system.

Based on the above model, the adsorption amount at each freezing point shown in FIG. 1 and FIG. 2 was evaluated as follows. When the total concentration of surfactant added to a colloidal system is $C_{tot}$, the concentration of adsorption species is S and the concentration of dissolved species is C, $$C_{tot} = S + C \qquad (1).$$

In addition, increases in Z and $C_s$ by addition of a surfactant are ΔZ and $\Delta C_s$ respectively. Here, there is the following proportional relation between ΔZ and S (unit: mol/L):

$$\Delta Z = [4\pi a_p^3 N_A/(3000\varphi)]S = KS$$

Here, $a_p$ is a particle radius, $N_A$ is Avogadro number, φ is a particle concentration represented by volume fraction and K is a proportional constant. When the number of charges on polystyrene particles before adsorption is $Z_0$, the number of charges after adsorption is $Z = Z_0 + \Delta Z$. However, crystallization and further interactions between colloidal particles are not determined by Z but "the number of effective charges" $Z_{eff}$. That is, the counter ions of colloidal particles are drawn into a strong electric field on the surface of the particles and "condensed" to decrease a practically effective electric field, and thus $Z_{eff}$ is generally lower than Z. It is also known that $\alpha = Z_{eff}/Z$ decreases with an increase in Z. Given $\Delta Z \ll Z$ and α=constant, when a surfactant is added, $$Z_{eff} = \alpha(Z_0 + \Delta Z) = \alpha(Z_0 + KS)$$

or $$S = (Z_{eff}/\alpha - Z_0)/K \qquad (2).$$

In addition, when a surfactant was not added, $Z_{eff}$, $Z_o$ and α obtained by measuring electrical conductivity were 1055, 11228 and 0.094 respectively.

On the other hand, when $\Delta C_s = C$ and an initial salt concentration, which is an experiment condition, $C_{S0} = 0$, $$C_S = C_{S0} + \Delta C_s = C \qquad (3)$$

From the formulae (1), (2) and (3), a relationship between S and C at a $C_{tot}$ is obtained. In FIG. 5, relationships between $Z_{eff}$ and $C_s$ at several $C_{tot}$ are shown using solid lines.

In the meanwhile, a crystallization phase diagram of a charged particle system has been studies using a computer simulation method by Robbins et al. (Document 4) described below), and the $C_s$ values at the freezing point at various $Z_{eff}$ values can be calculated. In FIG. 6, the experimental values (symbol) of a crystallization phase diagram of a NaCl-added system, and the calculated values (dashed line) based on the results of simulation are shown. The agreement of the two is good. In FIG. 5, relationships between $Z_{eff}$ and $C_s$ at several temperatures T were shown using dashed lines.

4) Robbins, M. O., Kremer, K., and Grest, G. S., J. Chem. Phys. 1988, 88, 3286.

The values of $Z_{eff}$ and $C_s$ at a freezing point can be determined by using FIG. 5. The freezing point T* of a surfactant having 14 carbon atoms is, for example when $C_{tot}$=15 μm, T*=20° C. (FIG. 2). In FIG. 5, $Z_{eff}$ and $C_s$ which satisfy a combination of $C_{tot}$ and T* (an intersection point of the solid line of $C_{tot}$=15 μm and the dashed line of T*=20° C.) are a value at the freezing point. In addition, S and C at the freezing point can be determined using these values.

$S/C_{tot}$ and $C/C_{tot}$ at the freezing point of a colloidal dispersion liquid to which sodium tetradecyl sulfate was added were plotted against $C_{tot}$. The results are shown in FIG. 7. The T* values vary depending on $C_{tot}$ (T*=10-50° C., as $C_{tot}$ is lower, temperature is higher). In an adsorption phenomenon, $S/C_{tot}$ generally decreases with an increase in $C_{tot}$, but oppositely increases in the results in FIG. 5. This is believed to be a result of different temperatures in each datum of FIG. 7, and suggests that the adsorption amount decreases with increasing temperature.

Table 1 summarizes the $S/C_{tot}$ and $C/C_{tot}$ of various surfactants at T*=20° C. In the case of a surfactant having 18 carbon atoms which the number of carbons n in the alkyl chain is highest, an adsorption of approximately 90% of amount added was calculated.

TABLE 1

| n | $C_{tot}$ (μM) | Cs (μM) | $Z_{\mathit{off}}$ | $S/C_{tot}$ (%) | $C/C_{tot}$ (%) |
|---|---|---|---|---|---|
| 6  | 12  | 8.8  | 1078 | 26.1 | 73.3 |
| 12 | 12  | 8.8  | 1078 | 26.7 | 73.3 |
| 14 | 15  | 8.9  | 1098 | 40.5 | 59.5 |
| 16 | 42  | 10.1 | 1285 | 76.0 | 24.0 |
| 18 | 100 | 11.9 | 1680 | 88.1 | 11.9 |

Example 6

In Example 6, the repeated experiment of the crystallization and melting of a colloidal crystal was carried out using water:ethylene glycol=10:90 (by volume ratio) as a liquid used for a colloidal dispersion liquid. The detail will now be described.

An aqueous suspension of polystyrene particles synthesized in the same method as in Examples 1 to 5 was used as colloidal particles. A colloidal dispersion liquid in which the concentration of polystyrene particles was 2.6% by volume, and to which sodium dodecyl sulfate was added in order to be 45 μM, which was added in order to be a given concentration, was used. This was put into a colorless polymethyl methacrylate cell in the form of a prismatic container (internal dimensions of 10 mm×10 mm×45 mm), and the cell was tightly stoppered with a plastic cap. The colorless cell containing a colloidal dispersion liquid was put into a constant-temperature water bath set to a given temperature (every 10° C. from 5 to 55° C.), and visual inspection and reflectance spectrum measurement were carried out. In the constant-temperature water bath, heating and cooling were repeated and it was confirmed that the crystallization (that is, the onset of ordering of colloid) and melting of a colloidal crystal were repeated (crystallization at 25.7° C.→melting at 45° C.→crystallization at 25.7° C.→melting at 48° C.→crystallization at 4° C.→melting at 36° C.).

Example 7

In Example 7, as with Examples 1 to 5, using polystyrene particles synthesized by soap-free emulsion polymerization (NSS10, the particle diameter=122±11 nm, the number of effective surface charges=700), the particle concentration was set to 1% by volume and hexyl sulfate sodium salt (the number of carbons=6) was added as an anionic surfactant to obtain a colloidal dispersion liquid. The existence of the formation of a crystal was observed at several temperatures in the same means as in Examples 1 to 5 to make a crystallization phase diagram.

Example 8

In Example 8, octadecyl sulfate sodium salt was used as an anionic surfactant. The others are the same as in Example 7 and the explanation is omitted.

Comparative Example 2

In Comparative Example 2, NaCl was added in place of a surfactant. The others are the same as in Example 7 and Example 8 and the explanation is omitted.

A crystallization phase diagram of Example 7 and Comparative Example 2 is shown in FIG. 8. In addition, a crystallization phase diagram of Example 8 and Comparative Example 2 is shown in FIG. 9. From these figures, it turned out that in Example 7 and Example 8 using sodium alkyl sulfate as an anionic surfactant, the slope of both graphs was small as compared to Comparative Example 2 to which NaCl was added in place of an anionic surfactant and the freezing point was easily controlled by changing concentrations. In the case where Example 8 having a long alkyl group in sodium alkyl sulfate (the number of carbons in the alkyl group is 18) was used, the slope of the graph was small as compared to that of the case where Example 7 having a short alkyl group (the number of carbons in the alkyl group is 6) was used, and thus it turned out that when an alkyl group was extended, the control of the freezing point by adjusting concentrations became easy.

Example 9

In Example 9, cationic particles having a positive charge were used as colloidal particles. A colloidal dispersion liquid to which a cationic surfactant was added as an ionic surfactant was studied.

That is, styrene and 2-vinylpyridine salt were used as monomers, and spherical poly(styrene-2-vinylpyridine copolymer) particles were synthesized by soap-free emulsion polymerization. Cetylpyridinium Chloride (CPC) was added as a cationic surfactant in a given concentration to a dispersion liquid (the particle concentration=1.3% by volume) sufficiently purified by dialysis and an ion exchange method to obtain a colloidal dispersion liquid. The critical micelle concentration CMC of CPC is 900 μM at room temperature, and all experiments were carried out at equal to or lower than CMC. The particle diameter of colloidal particles obtained by a dynamic light scattering method was 193 mu.

Comparative Example 3

In Comparative Example 3, NaCl was added in place of a surfactant. The others are the same as in Example 9 and the explanation is omitted.

A crystallization phase diagram of Example 9 and Comparative Example 3 is shown in FIG. 10. From this figure, it turned out that in Example 9 using CPC as a cationic surfactant, the slope of the graph was small as compared to that of Comparative Example 3 to which NaCl was added in place of a cationic surfactant, and the freezing point could be easily controlled by changing concentrations.

<The Colloidal Crystal Growth Experiment in One Direction>

The colloidal crystal growth experiment in one direction was carried out by expanding a temperature region, in which a colloidal crystal can be formed, in one direction.

Temperature Controlling Device

A temperature controlling device used in the experiment is shown in FIG. 11. In this device, Peltier elements 9 to 15 are fixed in rows on the radiator plate 1. In each Peltier element 9 to 15, a thermocouple, not shown in the figure, is embedded. Each Peltier element 9 to 15 and each thermocouple are connected to a control section, not shown in the figure, and can be controlled to any temperature.

Preparation for a Colloidal Dispersion Liquid

The same suspension of polystyrene particles as in Example 6 was prepared, and to this, sodium dodecyl sulfate and dilution water were added to obtain a colloidal dispersion liquid in which the particle concentration was 1% by volume and the concentration of sodium dodecyl sulfate was 9.8 µM.

Temperature Control of a Colloidal Dispersion Liquid

As shown in FIG. 12, a quartz cell 2 in the form of a thin plate with a width of 10 mm, a length of 50 mm and an optical path length of 1 mm was prepared, and a colloidal dispersion liquid was put therein and this cell was placed on the Peltier elements 9 to 15. Using the control section, the temperature of the surface on which the Peltier elements 9 to 15 came into contact with the quartz cell 2 was set to 32.5° C. at which a colloidal dispersion liquid becomes a melted state, and then the Peltier element 9 was changed from 32.5° C. to 10° C. The temperature at which a colloidal dispersion liquid becomes a colloidal crystal state is 10° C. After a lapse of 3 minutes, the Peltier element 10 adjacent thereto was changed from 32.5° C. to 10° C. At every 3 minutes, the elements were further consecutively set to 10° C. in the direction of the Peltier element 15, and finally the temperature of all surfaces on which the Peltier elements 9 to 15 came into contact with the quartz cell 2 was set to 10° C. By doing this, a temperature region of 10° C. in the quartz cell 2 was expanded and the condition of a colloidal crystal was observed.

(Results)

As a result, the region of a colloidal crystal was gradually expanded as shown in FIG. 13, and the growth of the colloidal crystal was observed.

An example of a reflectance spectrum of the crystal grown in one direction thus made is shown in FIG. 14. Using a HR type fiber spectrophotometer manufactured by Ocean Optics for measurement, the reflectance of a spot with a diameter of approximately 1 mm was measured at two different points of the crystal. Colloidal crystals showing a sharp reflection peak (half-width 7 nm or less) are obtained. As the size of the crystals, the largest one reached to a thickness of 1 mm, a length of 3 mm and a width of 3 mm.

As described above, it turned out that a colloidal dispersion liquid was set to the temperature at which a colloidal crystal was in a melted state, followed by gradually expanding a temperature region in which a colloidal crystal was formed, and a colloidal crystal with mm size and excellent optical characteristics could be obtained. Considering the use of colloidal crystals as optical elements, it can be said that the present means is an extremely advantageous production method.

<Gelation of a Colloidal Crystal>

The colloidal crystal made in the above colloidal crystal growth experiment can be fixed by a known method (Japanese Patent Application No. 2004-375594: colloidal crystal fixed in gel, Inventors: Junpei Yamanaka, Masako Murai, Koji Yamada, Hiroshi Ozaki, Fumio Uchida, Tsutomu Sawada, Akiko Toyotama, Kensaku Ito, Yoshihiro Takiguchi, Hirohito Hira, Applicants: Japan Aerospace Exploration Agency and Fuji Kagaku Corp.). The specific example will be now given.

A polystyrene colloidal dispersion liquid having the following composition is prepared:

Gel monomer: N,N'-dimethylol acrylamide (N-MAM) 0.67 mol/L;

Cross-linking agent: methylene bisacrylamide (BIS) 10 mmol/L;

Photopolymerization initiator: 2,2'-azobis[2-methyl-N-[2-hydroxyethyl]-propionamide 4 mg/mL;

the volume fraction ($\varphi$) of colloidal particles in a polystyrene colloidal dispersion liquid=0.01; and Sodium dodecyl sulfate: 10 µmol/L.

The polystyrene colloidal dispersion liquid having the above composition is put into a quartz cell with a cell optical path length of 1 mm, and this is put in the temperature controlling device used in the colloidal crystal growth experiment. After setting it to the temperature at which a colloidal crystal is not formed, a temperature region in which a colloidal crystal can be formed is expanded in one direction. The gel monomer is polymerized by ultraviolet irradiation to the colloidal crystal thus obtained to obtain a gelatinized colloidal crystal.

Example 10

In Example 10, the following test on colloidal crystals was carried out using silica particles with a particle diameter of 100 nm.

An aqueous dispersion liquid of silica colloidal particles (a particle diameter of 100 nm) was sufficiently desalinated and purified by dialysis and an ion exchange method, and was used with an impurity ion concentration of 1 µM or less. The surface charge density of particles obtained by an electric conductivity method was 0.1 µC/cm$^2$ (the number of charges is approximately 180/particle). The aqueous dispersion liquid was adjusted with purified water so that the particle concentration would be 5% by volume (the volume fraction=0.05). To the silica colloidal dispersion liquid thus obtained, an aqueous solution of polyoxyethylene (the average polymerization degree=15) nonylphenyl ether (hereinafter, abbreviated to E15PhC9), a nonionic surfactant, was added so that the concentration of E15PhC9 would be 0.5 mM. It has been reported that E15PhC9 adsorbs to silica particles by a hydrogen bond between the ethylene glycol part and the non-dissociated silanol group on the surface of silica. From the evaluation test results of the adsorption amount to silica described below, it is believed that 90% or more of 0.5 mM E15PhC9 added to this silica colloidal dispersion liquid adsorbs to the surface of particles.

Furthermore, to this E15PhC9-added silica colloidal dispersion liquid, sodium octadecyl sulfate (SOS), an anionic surfactant, was added in a given amount, and the temperature was changed, and the existence of the formation of a colloidal crystal was investigated. A distinction between crystal and noncrystal was carried out by observing the existence of Bragg diffraction peak by spectrophotometry. As a result, a colloidal crystal producing iridescence was formed under conditions of a given SOS concentration and temperature. The colloidal crystal was melted by heating and was recrystallized by cooling. That is, crystallization was reversible. When SOS is not added and the SOS concentration is low, this colloidal dispersion liquid is in a noncrystal state. This is believed to be the reason that the number of charges of silica is low.

FIG. 15 shows a crystallization phase diagram drawn using the SOS concentration and temperature as variables. As can be seen from this figure, the number of charges increased with an increase in the SOS concentration, and the temperature for crystallization became high (on the contrary, in the case of polystyrene, such behavior is not shown. This is believed to be the reason that the original number of charges is sufficiently large even without adding SOS). Furthermore, when the SOS concentration increased, a noncrystal state was obtained again. This is believed to be the reason that the ionic strength increases by increasing the non-adsorbent SOS concentration (this is the same as the case of polystyrene).

As described above, it was revealed that a nonionic surfactant was added to silica colloidal particles to make a hydrophobic part on the surface of particles, and further the ionic surfactant was adsorbed thereto to increase the surface charge of particles and crystallization occurred. It also turned out that by using temperature dependence of the adsorption amount of surfactants (both nonionic and ionic), reversible control was possible, for example, the colloidal crystallization and non-crystallization of a silica colloidal dispersion liquid due to temperature changes are carried out.

The above reversible behavior of a silica colloidal dispersion liquid was not dependent on the order of adding surfactants, and the same behaviors were shown. That is, even when SOS was firstly added to silica colloid and E15PhC9 was then added thereto, a colloidal crystal was formed in the same manner.

(Evaluation Test of the Adsorption Amount of E15PhC9 to Silica)

Using the ultraviolet absorption band around 275 nm based on the phenyl group in E15PhC9, absorbance was measured at such wavelength to make a calibration curve.

Next, E15PhC9 with several concentrations was added to a silica particle dispersion liquid (a particle diameter of 300 nm, a particle concentration of 1% by volume and 5% by volume), and the obtained liquid was shaken for one hour by a shaker, followed by centrifugation at 4000 rpm for 10 minutes to separate supernatant and a precipitated silica particle layer. The concentration of E15PhC9 in the supernatant was determined by spectroscopy to obtain an adsorption amount.

As a result, it turned out that in the case of a silica particle concentration of 5% by volume, when the concentration of E15PhC9 added was 1 mM, approximately 90% of E15PhC9 adsorbed to silica particles and when the concentration of E15PhC9 was 0.5 mM, approximately 80% of E15PhC9 adsorbed to silica particles.

In Example 10, silica colloidal particles with a particle diameter of 100 nm were used. When the particle concentration is equal, the total surface area of particles is in proportion to the particle diameter. By calculating based on this relationship, the adsorption amount of E15PhC9 is estimated to be 90% or more under conditions of the above crystallization experiment in Example 10.

Similarly, the adsorption behavior of a surfactant having a polyoxyethylene nonylphenyl ether structure and having an average polymerization degree of polyoxyethylene chain of 20 and 10 was also investigated. As a result, in the case of an average polymerization degree of 20, the molar adsorption curve was almost same as that of the case of 15. On the other hand, in the case of an average polymerization degree of 10, adsorption was remarkably inhibited as compared to that of the case of 15.

Example 11

In Example 11, the following test on colloidal crystals was carried out using silica particles with a particle diameter of 230 nm.

An aqueous dispersion liquid of silica colloidal particles (a particle diameter of 230 nm) was sufficiently desalinated and purified by dialysis and an ion exchange method, and was used with an impurity ion concentration of 1 μM or less. The surface charge density of particles obtained by an electric conductivity method was 0.1 μC/cm$^2$ (the number of charges is approximately 700/particle). Purified water was added thereto so that the particle concentration would be 5% by volume (the volume fraction=0.05) and 10% by volume (the volume fraction=0.10). Both samples were in a colloidal crystal state at a temperature of 5° C. to 50° C.

To 5% by volume of a silica colloidal dispersion liquid prepared as described above, E15PhC9 was added to obtain a concentration of 0.232 mM. Next, SOS was added thereto to obtain a concentration of 24 μM. The colloidal dispersion liquid was in a colloidal crystal state at 20° C. and melted at 60° C., and by further cooling this to room temperature, colloidal crystallization occurred again. That is, colloidal crystallization was reversible. Similarly, to 10% by volume of a silica colloidal dispersion liquid, E15PhC9 was added so that the concentration would be 2.16 mM, and an aqueous solution of SOS was added so that the concentration would be 180 and 190 μM. These colloid samples were in a crystal state at 20° C. and melted at 60° C., and by further cooling these samples to room temperature, colloidal crystallization occurred again. That is, colloidal crystallization could be carried out reversibly.

Example 12

An aqueous dispersion liquid of silica colloidal particles (a particle diameter of 230 nm) was sufficiently desalinated and purified by dialysis and an ion exchange method, and was used with an impurity ion concentration of 1 μM or less. The surface charge density of particles obtained by an electric conductivity method was 0.1 μC/cm$^2$ (the number of charges is approximately 1500/particle). The particle concentration was set to 5% by volume (the volume fraction=0.05), and the aqueous dispersion liquid was used in a system to which a salt was not added. It turned out that a clear peak of a reflectance spectrum was observed at room temperature (approximately 20° C.) and the sample was crystallized. To this silica colloid, E15PhC9 was added to obtain a concentration of 0.17 mM. Next, SOS was added thereto to obtain a concentration of 12 M. The colloid to which these surfactants were added was also crystallized at room temperature and the crystal did not disappear even when cooled to 5° C. On the other hand, when this colloid was heated to 60° C., the crystal peak disappeared and a non-crystal state was obtained. When this was further cooled to 5° C., crystallization occurred again. By repeatedly maintaining at 5° C. and 60° C., the formation and melting of the crystal repeatedly occurred. That is, crystallization was reversible.

Example 13

In Example 13, the following test on colloidal crystals was carried out using titania particles.

That is, titania particles (manufactured by Fuji Kagaku Corp., the particle diameter determined by a dynamic light scattering method=250 nm) was used, and to an aqueous dispersion liquid with a titania particle concentration=15% by volume, E15PhC9 was added so that the concentration would be 0.60 mM. SOS was further added thereto so that the concentration would be 60 μM to obtain a titania colloidal dispersion liquid.

About the above titania colloidal dispersion liquid to which E15PhC9 and SOS were added, and the titania colloidal dispersion liquid to which only E15PhC9 was added before addition of SOS, reflectance spectra were measured at room temperature. As a result, as shown in FIG. 16, clear reflectance peaks showing the existence of a colloidal crystal were confirmed at room temperature (25° C.) from both dispersion liquids. Furthermore, it turned out that when the titania colloidal dispersion liquid to which E15PhC9 and SOS were added was maintained at 60° C. for 10 minutes, the peak strength remarkably decreased and the titania colloidal dispersion liquid moved to a noncrystal state. Furthermore, it turned out that when the titania colloidal dispersion liquid was maintained at 5° C. for 10 minutes, the peak strength increased again at the same wavelength and a colloidal crystal was formed again. Furthermore, it turned out that when the same temperature operation was repeated, the same spectrum changes were shown, and colloidal crystallization and non-crystallization could be carried out reversibly.

The present invention is not limited to the explanation of the above embodiments and Examples of the present invention. Several modified embodiments are also included in the present invention without departing from the scope of claims within the scope which those skilled in the art can easily conceive.

INDUSTRIAL APPLICABILITY

Figure 1:
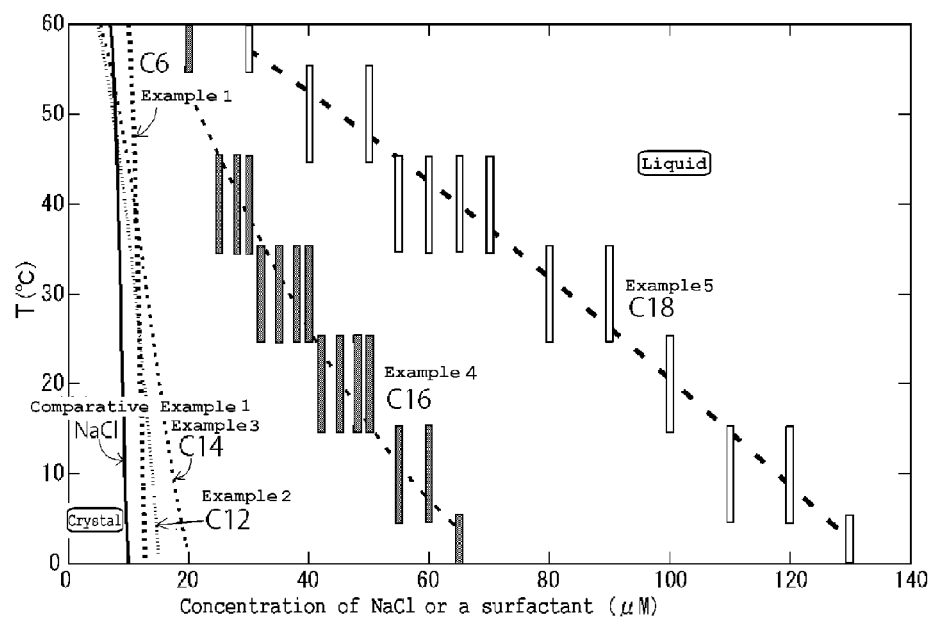
FIG. 1 is a crystallization phase diagram obtained by the observation of colloidal dispersion liquids in Examples 1 to 5 and Comparative Example 1 under each temperature.
Figure 2:
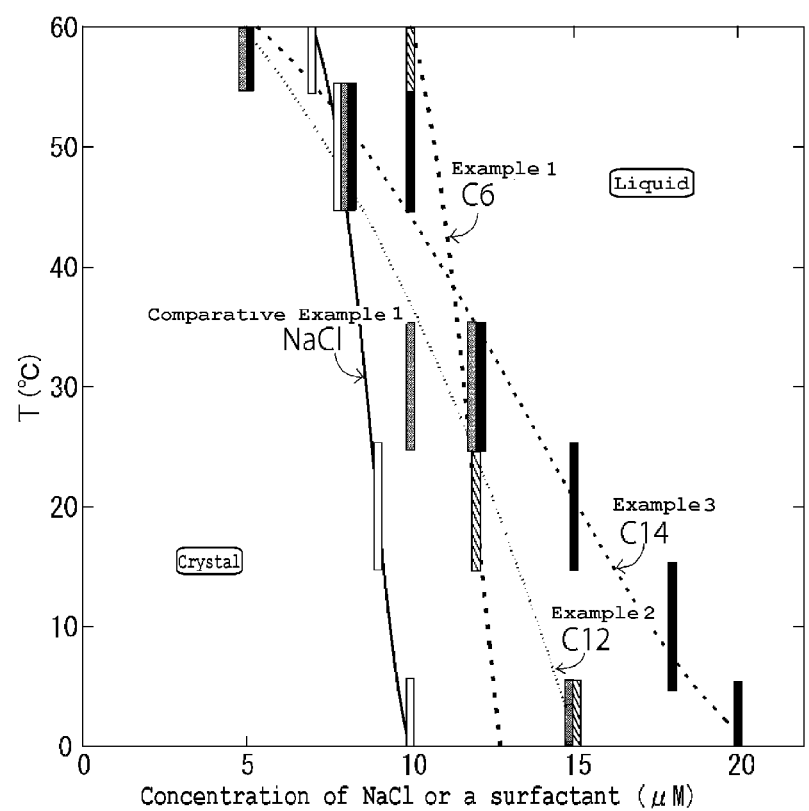
FIG. 2 is a crystallization phase diagram obtained by the observation of colloidal dispersion liquids in Examples 1 to 3 and Comparative Example 1 under each temperature.
Figure 3:
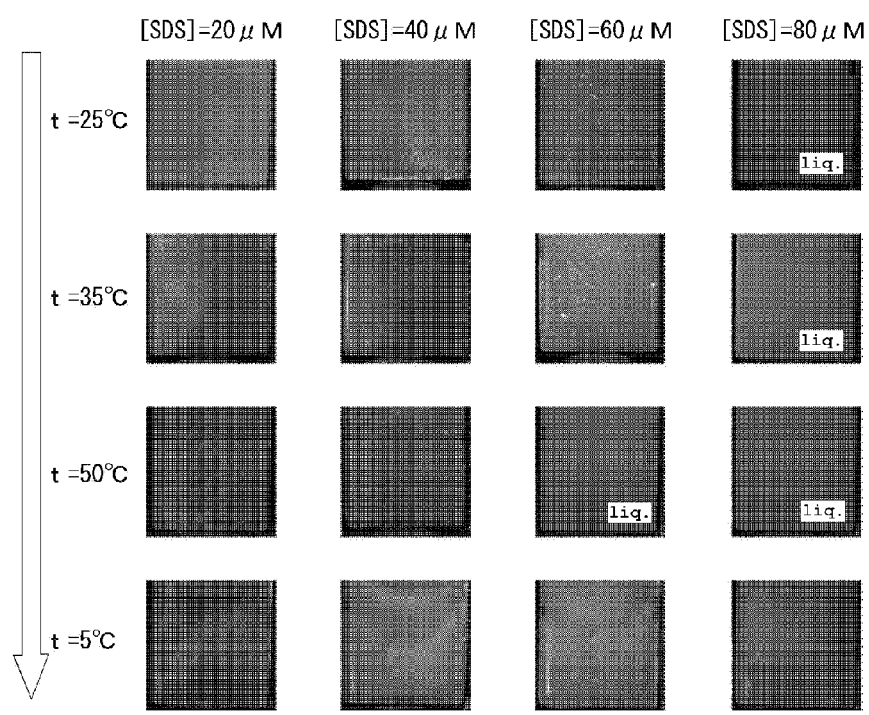
FIG. 3 is photographs substitute for diagram of colloidal dispersion liquids to which an ionic surfactant is added in each composition at each temperature.
Figure 4:
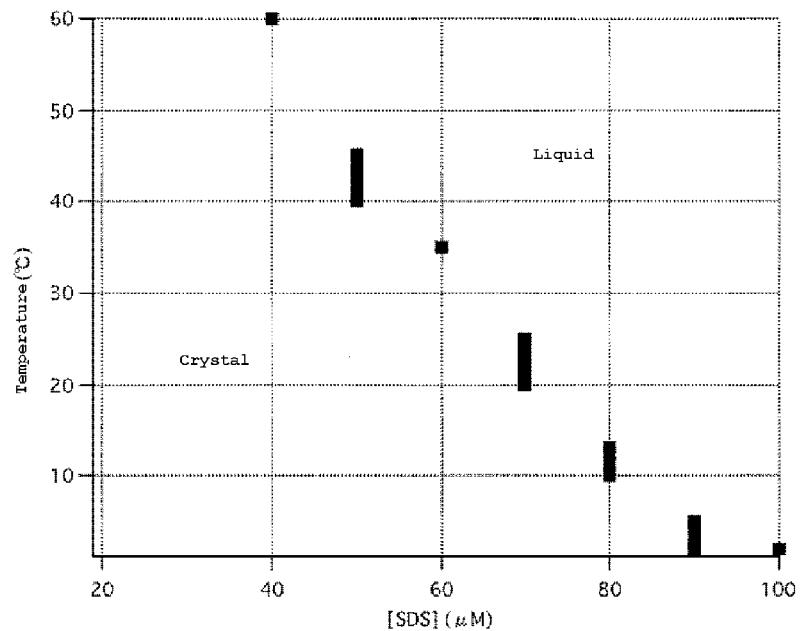
FIG. 4 is a crystallization phase diagram obtained by the observation of the colloidal dispersion liquid having a polystyrene particle concentration of 2.5% by volume under each temperature.
Figure 5:
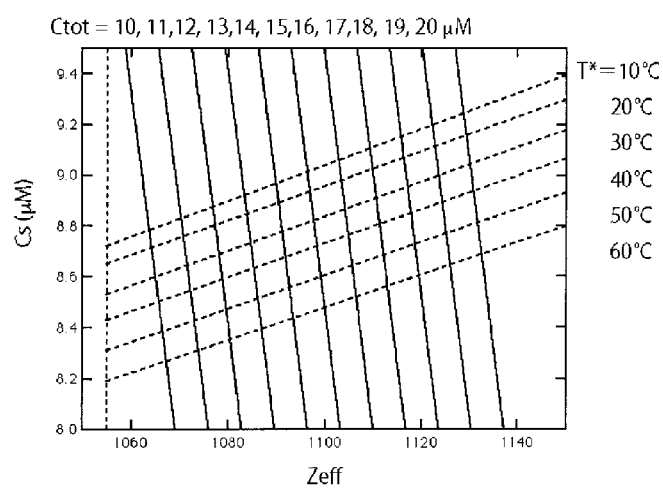
FIG. 5 is a graph showing a relationship between $Z_{eff}$ and $C_s$ against several $C_{tot}$.
Figure 6:
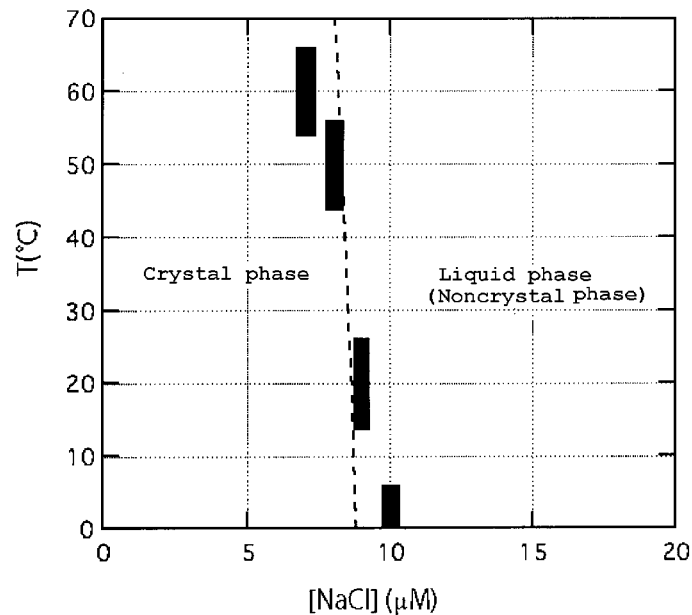
FIG. 6 is a graph showing the experimental values (symbol) of a crystallization phase diagram of a colloidal dispersion liquid to which NaCl is added, and the calculation values (dashed line) based on the simulation results.
Figure 7:
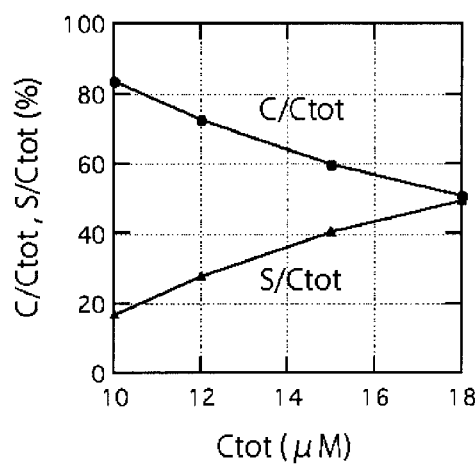
FIG. 7 is a graph obtained by plotting $S/C_{tot}$ and $C/C_{tot}$ against $C_{tot}$ at the freezing point of a colloidal dispersion liquid to which sodium tetradecyl sulfate is added.
Figure 8:
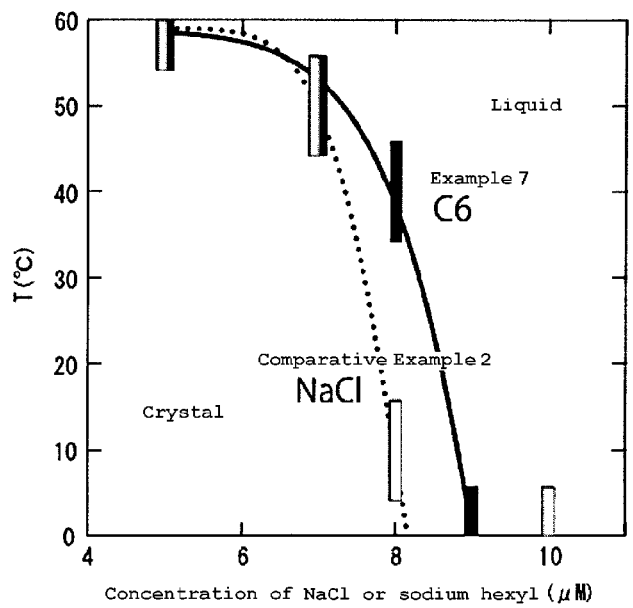
FIG. 8 is a crystallization phase diagram obtained by the observation of colloidal dispersion liquids in Example 7 and Comparative Example 2 under each temperature.
Figure 9:
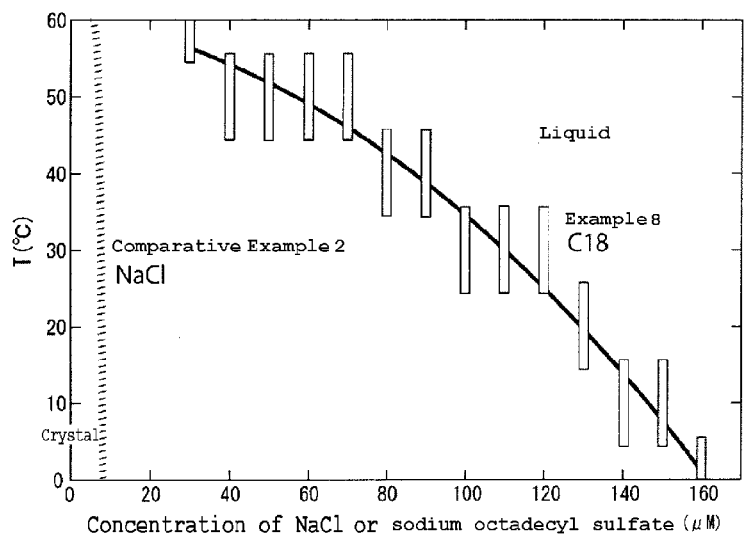
FIG. 9 is a crystallization phase diagram obtained by the observation of colloidal dispersion liquids in Example 8 and Comparative Example 2 under each temperature.
Figure 10:
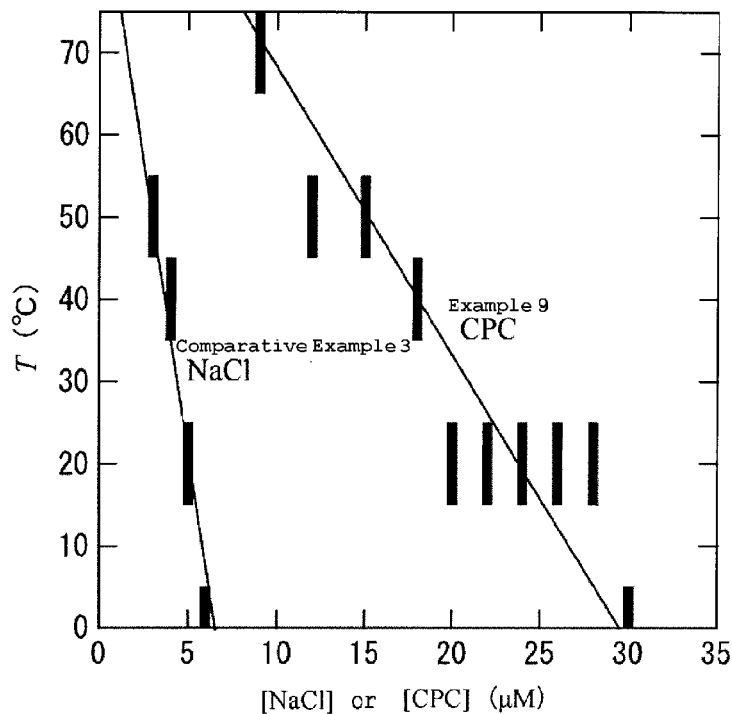
FIG. 10 is a crystallization phase diagram obtained by the observation of colloidal dispersion liquids in Example 9 and Comparative Example 3 under each temperature.
Figure 11:
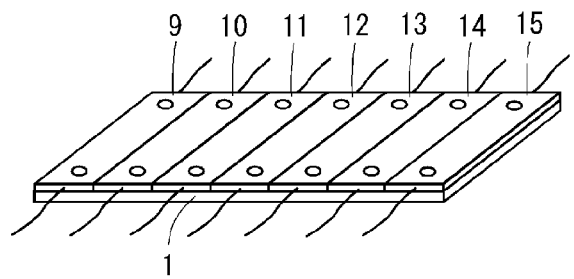
FIG. 11 is a perspective view of a temperature controlling device used for the colloidal crystal growth experiment in one direction.
Figure 12:
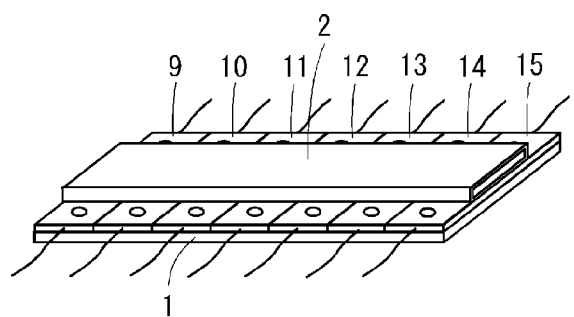
FIG. 12 is a perspective view showing a state in which a quartz cell is set on a temperature controlling device used for the colloidal crystal growth experiment in one direction.
Figure 13:
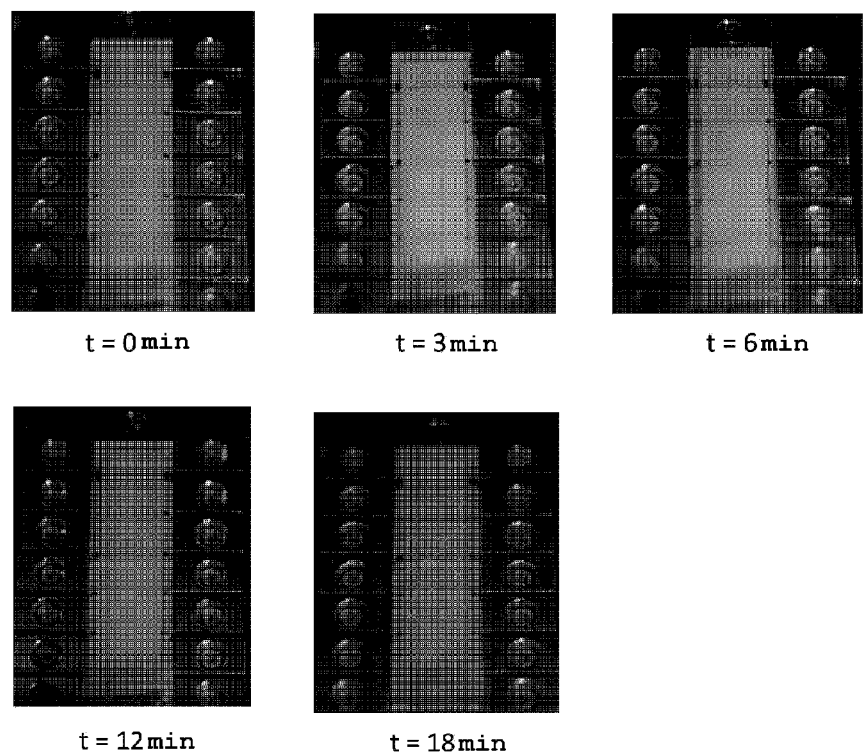
FIG. 13 is photographs substitute for diagram showing the results of the colloidal crystal growth experiment in one direction.
Figure 14:
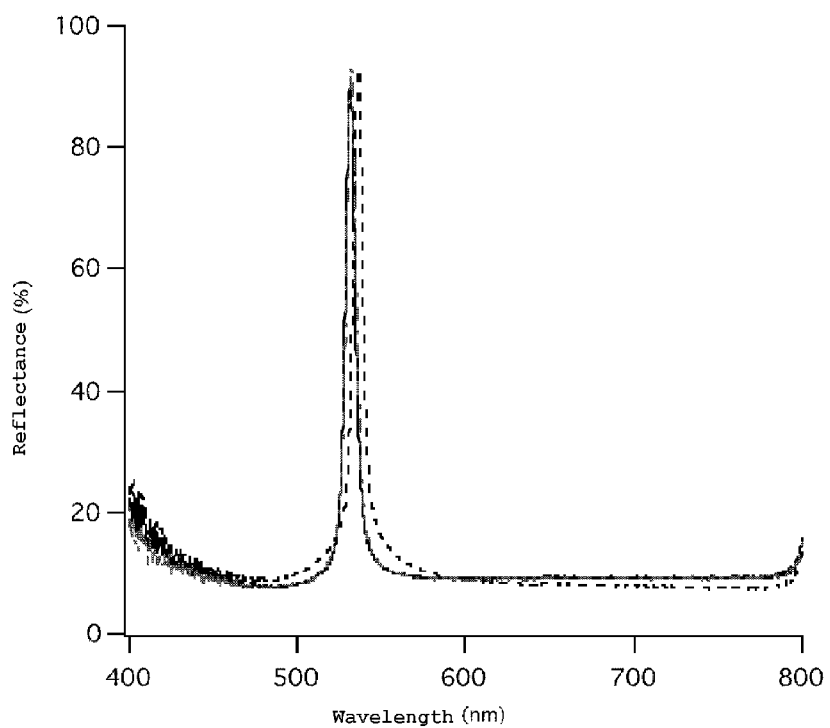
FIG. 14 is a reflectance spectrum of a colloidal crystal obtained in the colloidal crystal growth experiment in one direction.
Figure 15:
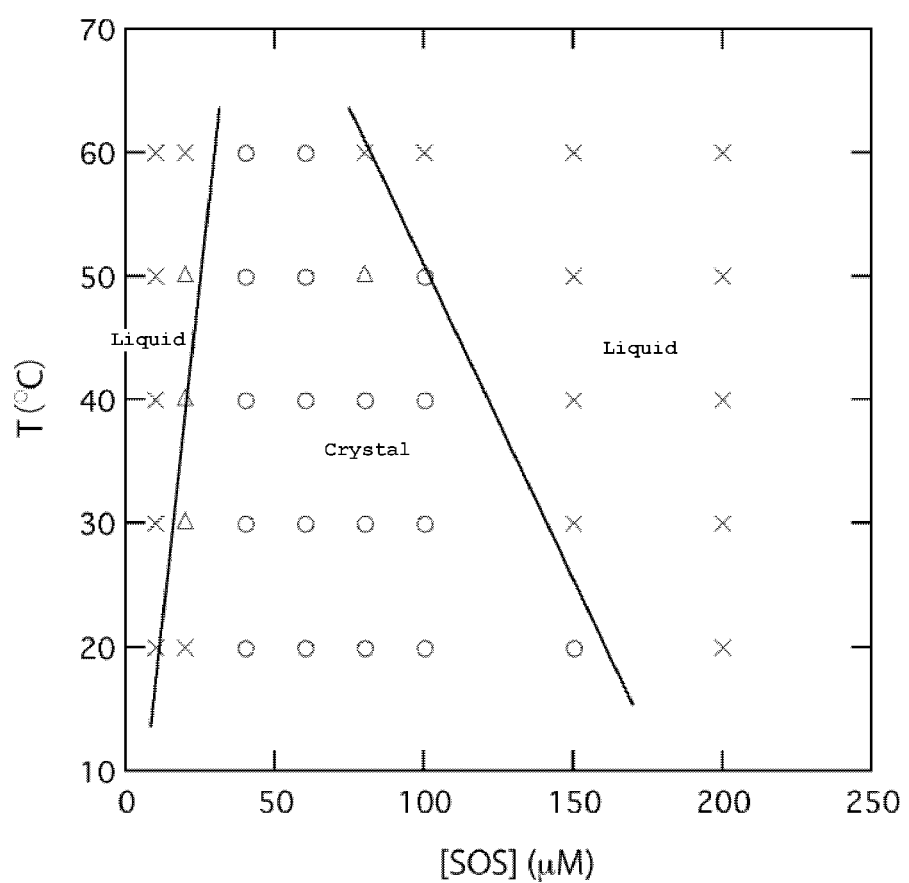
FIG. 15 is a crystallization phase diagram of a system in which 0.5 mM E15PhC9 and SOS with several concentrations are added to silica colloid (a particle diameter of 100 nm, 5% by volume) (in the figure, the open circle shows that the whole sample is in a colloidal crystal state, the triangle shows that a part of sample is a crystal and the cross shows that the whole sample is in a noncrystal state. In the figure, the straight line shows a border of crystal/liquid phases).
Figure 16:
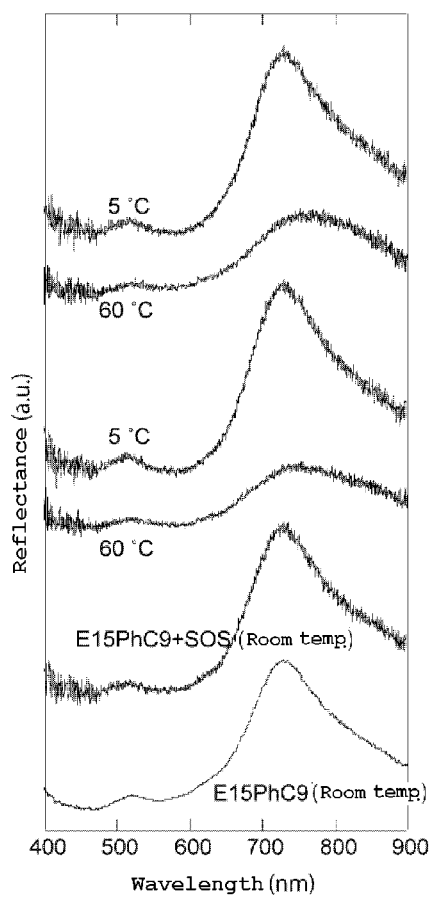
FIG. 16 is a reflectance spectra of a titania colloidal dispersion liquid.

As with normal crystals, the colloidal crystal Bragg-diffracts electromagnetic waves. The diffraction wavelength can be set to a visible light region by selecting experimental conditions (particle concentration and particle diameter). This enables applications and developments to an optical element including a photonic material and the like.

The invention claimed is:

1. A method for producing a colloidal crystal, comprising:
a preparation step of preparing a charged colloidal dispersion liquid, comprising a liquid, colloidal particles and an ionic surfactant, wherein the colloidal particles are dispersed in the liquid, and a concentration of the ionic surfactant, which is not adsorbed to the colloidal particles but is dissolved in the liquid, is equal to or lower than a critical micelle concentration, so that the colloidal crystal can be formed due to temperature changes, and
a crystallization step of preparing the colloidal crystal by changing temperature of the charged colloidal dispersion liquid from a temperature range in which the colloidal crystal is not formed to a temperature range in which the colloidal crystal is formed, wherein
the colloidal crystal is a three-dimensional colloidal crystal.

2. The method for producing the colloidal crystal according to claim 1, wherein the ionic surfactant is an anionic surfactant or a cationic surfactant.

3. The method for producing the colloidal crystal according to claim 2, wherein the liquid is any of water, an alcohol and a mixture of water and an alcohol.

4. The method for producing the colloidal crystal according to claim 2, wherein the colloidal particles consist of an organic polymer.

5. The method for producing the colloidal crystal according to claim 2, wherein the crystallization step comprises:
a temperature setting step of setting the whole of the charged colloidal dispersion liquid contained in a container to the temperature at which the colloidal crystal is not formed;
a crystallization initiation step of setting the charged colloidal dispersion liquid which is set to the temperature at which the colloidal crystal is not formed, to temperature at which the colloidal crystal is partially formed; and
a crystal growth step of growing the colloidal crystal by gradually expanding the range set to the temperature at which the colloidal crystal is formed.

6. The method for producing the colloidal crystal according to claim 2, wherein the charged colloidal dispersion liquid is immobilized by gelation after growing the colloidal crystal.

7. The method for producing the colloidal crystal according to claim 1, wherein the liquid is any of water, an alcohol and a mixture of water and an alcohol.

8. The method for producing the colloidal crystal according to claim 7, wherein the colloidal particles consist of an organic polymer.

9. The method for producing the colloidal crystal according to claim 7, wherein the crystallization step comprises:

a temperature setting step of setting the whole of the charged colloidal dispersion liquid contained in a container to the temperature at which the colloidal crystal is not formed;

a crystallization initiation step of setting the charged colloidal dispersion liquid which is set to the temperature at which the colloidal crystal is not formed, to temperature at which the colloidal crystal is partially formed; and a crystal growth step of growing the colloidal crystal by gradually expanding the range set to the temperature at which the colloidal crystal is formed.

10. The method for producing the colloidal crystal according to claim 7, wherein the charged colloidal dispersion liquid is immobilized by gelation after growing the colloidal crystal.

11. The method for producing the colloidal crystal according to claim 1, wherein the colloidal particles consist of an organic polymer.

12. The method for producing the colloidal crystal according to claim 11, wherein the crystallization step comprises:

a temperature setting step of setting the whole of the charged colloidal dispersion liquid contained in a container to the temperature at which the colloidal crystal is not formed;

a crystallization initiation step of setting the charged colloidal dispersion liquid which is set to the temperature at which the colloidal crystal is not formed, to temperature at which the colloidal crystal is partially formed; and a crystal growth step of growing the colloidal crystal by gradually expanding the range set to the temperature at which the colloidal crystal is formed.

13. The method for producing the colloidal crystal according to claim 11, wherein the charged colloidal dispersion liquid is immobilized by gelation after growing the colloidal crystal.

14. The method for producing the colloidal crystal according to claim 1, wherein the crystallization step comprises:

a temperature setting step of setting the whole of the charged colloidal dispersion liquid contained in a container to the temperature at which the colloidal crystal is not formed;

a crystallization initiation step of setting the charged colloidal dispersion liquid which is set to the temperature at which the colloidal crystal is not formed, to temperature at which the colloidal crystal is partially formed; and a crystal growth step of growing the colloidal crystal by gradually expanding the range set to the temperature at which the colloidal crystal is formed.

15. The method for producing the colloidal crystal according to claim 1, wherein the charged colloidal dispersion liquid is immobilized by gelation after growing the colloidal crystal.

* * * * *